(12) United States Patent
Yu

(10) Patent No.: US 7,479,402 B2
(45) Date of Patent: Jan. 20, 2009

(54) COMB STRUCTURE FABRICATION METHODS AND SYSTEMS

(75) Inventor: Lianzhong Yu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 172 days.

(21) Appl. No.: 11/277,024

(22) Filed: Mar. 20, 2006

(65) Prior Publication Data

US 2007/0215961 A1 Sep. 20, 2007

(51) Int. Cl.
 *H01L 21/00* (2006.01)
(52) U.S. Cl. .......................... 438/50; 438/48; 438/459; 257/414
(58) Field of Classification Search ....................... None
See application file for complete search history.

(56) References Cited

U.S. PATENT DOCUMENTS

| | | | |
|---|---|---|---|
| 6,277,666 B1 * | 8/2001 | Hays et al. ..................... 438/50 |
| 6,384,952 B1 | 5/2002 | Clark et al. |
| 6,705,166 B2 | 3/2004 | Leonardson |
| 6,713,367 B2 * | 3/2004 | Solgaard et al. ............. 438/459 |
| 6,914,711 B2 | 7/2005 | Novotny et al. |
| 6,925,710 B1 | 8/2005 | Scalf et al. |
| 2004/0184132 A1 | 9/2004 | Novotny et al. |
| 2005/0231065 A1 | 10/2005 | Fu |
| 2005/0236928 A1 | 10/2005 | Kurozuka et al. |

\* cited by examiner

*Primary Examiner*—Minh-Loan T Tran
*Assistant Examiner*—Selim Ahmed
(74) *Attorney, Agent, or Firm*—Black Lowe & Graham PLLC

(57) ABSTRACT

A method of manufacturing a vertical comb structure for a micro electromechanical (MEMS) device. Tooth structures are formed on a first wafer. A second wafer is then bonded to the tooth structures of the first wafer. The tooth structures are then released to form a comb structure. Forming the tooth structures on the first wafer includes using oxidation, photolithography, etching, epitaxy, and chemical and mechanical polishing to create the tooth structures on the first wafer.

15 Claims, 3 Drawing Sheets

COMB STRUCTURE FABRICATION METHODS AND SYSTEMS

BACKGROUND OF THE INVENTION

The manufacture of microelectromechanical system (MEMS) devices is generally well-known, and there are numerous devices used in different applications and numerous methods of making those devices. An example of a method of manufacturing a MEMS device is contained in U.S. Pat. No. 6,925,710 titled "METHOD FOR MANUFACTURING MICROELECTROMECHANICAL COMB-DRIVE DEVICE" TO Scalf et al., herein incorporated by reference. An example of a MEMS device is contained in U.S. Pat. No. 6,705,166 titled "SMALL SIZE, HIGH CAPACITANCE READOUT SILICON BASED MEMS ACCELEROMETER" to Leonardson, herein incorporated by reference.

The Leonardson accelerometer provides an inexpensive force measurement device having high pick-off sensitivity in a high-G input range which can operate in a high-G shock environment by providing a capacitance pick-off force sensor having a proof mass with spaced-apart tooth-type electrodes (i.e., a comb structure) that is suspended by an annular suspension member.

One limitation of current methods of manufacturing the comb structure of the Leonardson accelerometer is the practice of manufacturing the proof mass and the cover plate separately, each including tooth-type electrodes, and then mechanically assembling the proof mass and the cover plate. This method requires mechanical alignment of the teeth of the proof mass with the recesses of the cover plate, and vice versa. Mechanical assembly in this way can achieve close tolerances between cover plate electrodes and adjacent proof mass electrodes, but not tolerance levels needed for comb drive devices. A need exists, therefore, for manufacturing methods that will allow smaller tolerances between adjacent electrodes than permitted by current manufacturing processes that use mechanical assembly.

BRIEF SUMMARY OF THE INVENTION

The present invention provides a method of manufacturing a comb structure on a MEMS device which can achieve much smaller tolerances between opposing teeth of the comb structure than current manufacturing methods.

According to one aspect of the method of the present invention, tooth structures are formed on a first wafer. A second wafer is then bonded to the tooth structures of the first wafer. The tooth structures are then released to form a comb structure.

According to another aspect of the present invention, forming the tooth structures on the first wafer includes using oxidation, photolithography, etching, epitaxy, and chemical and mechanical polishing to create the tooth structures on the first wafer.

According to a further aspect of the present invention, releasing the tooth structures to form a comb structure includes forming holes through one of the first or second wafers and introducing etchant through the holes to release the tooth structures and form a comb structure.

BRIEF DESCRIPTION OF THE SEVERAL VIEWS OF THE DRAWING

The preferred and alternative embodiments of the present invention are described in detail below with reference to the following drawings.

DETAILED DESCRIPTION OF THE INVENTION

Figure 1:
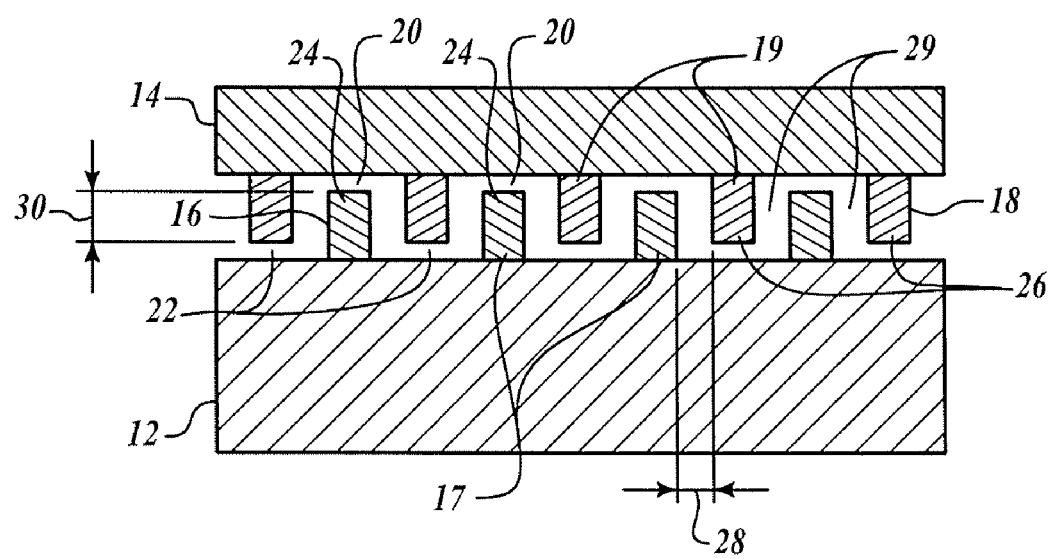
FIG. 1 shows a cross-sectional view of a finished comb structure manufactured according to a method of the present invention.

FIG. 1 shows a cross-section view of a finished comb structure 10 manufactured according to a method of the present invention. The structure 10 includes a first substrate layer 12 and a second substrate layer 14. By way of example and without loss of generality, the substrate layers 12, 14 may be silicon wafers. The first substrate layer 12 includes discretely formed first teeth 16 attached to the first substrate layer 12 at a first proximal end 17, and the second substrate layer 14 includes discretely formed second teeth 18 attached to the second substrate layer 14 at a second proximal end 19. First and second teeth 16, 18 have associated first and second recesses 20, 22 between a distal end 24, 26 of each tooth 16, 18 and the opposite substrate layer 14, 12, respectively. The structure additionally includes a separation distance 28 and spaces 29 between adjacent teeth 16, 18 and an overlap distance 30 between adjacent teeth 16, 18.

Figure 2A:
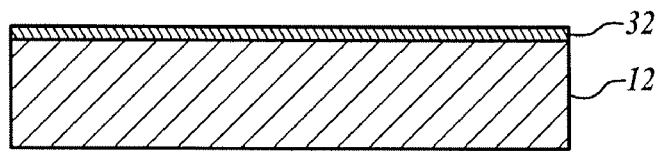
FIGS. 2A-2H show a comb structure after various steps of the method.
Figure 2B:
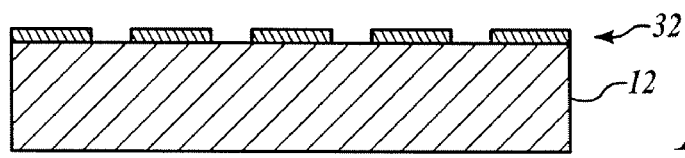

FIGS. 2A-2H illustrate the steps performed in the manufacture of the comb structure 10. FIG. 2A shows the first substrate layer 12 including a first insulating layer 32. In the example of the silicon first substrate layer 12, the first insulating layer 32 may be an oxide, such as silicon oxide produced by oxidizing a portion of the exposed surface of the first substrate layer 12, or the first insulating layer 32 may be a nitride or other sacrificial material. Portions of the first insulating layer 32 are selectively removed to produce the structure of FIG. 2B. Selective removal may be effected by masking, photolithography, and etching.

Figure 2C:
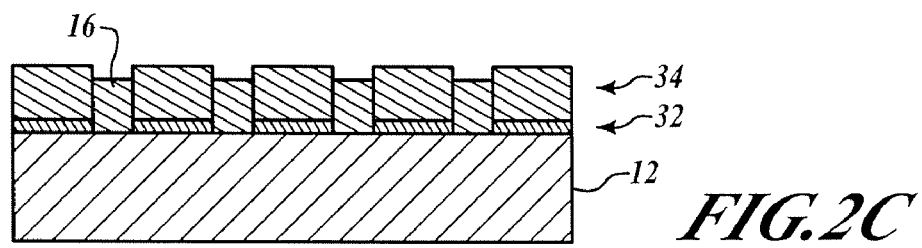

As shown in FIG. 2C, a first device layer 34 is deposited on the remaining portions of the first insulating layer 32 and on the exposed portions of the first substrate layer 12. Epitaxial growth may be used to effect the deposition. The first device layer 34 may be of the same material as the first substrate layer 12, or it may be a different material, including electrically conductive materials. The portions of the first device layer 34 deposited on the exposed portions of the first substrate layer 12 are the first teeth 16 of the finished comb structure 10, and the portions of the first device layer 34 deposited on the first insulating layer 32 will form the second teeth 18 of the finished device 10.

Figure 2D:
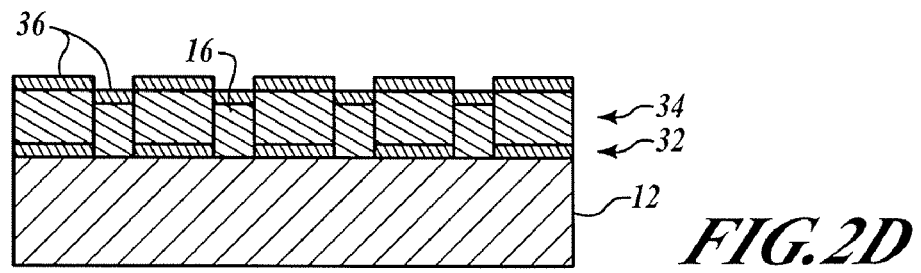
Figure 2E:
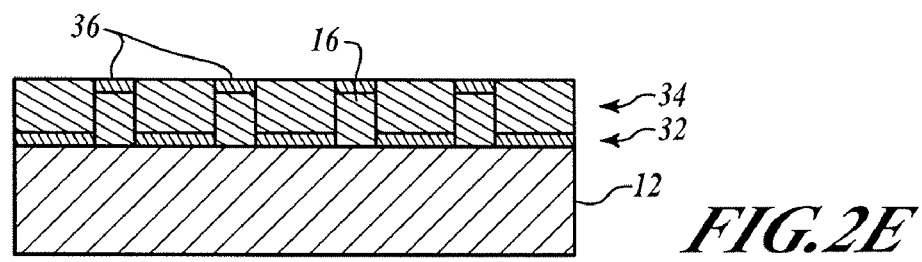

As shown in FIG. 2D, after deposition, a second insulating layer 36 is created through, for example, oxidation of the upper surfaces of the first device layer 34, and portions of the second insulating layer 36 are removed, using, for example, chemical and mechanical polishing, leaving the structure shown in FIG. 2E. Those portions of the second insulating layer 36 left on the first device layer 34 after removal will eventually be removed to leave first recesses 20 of first teeth 16.

Figure 2F:
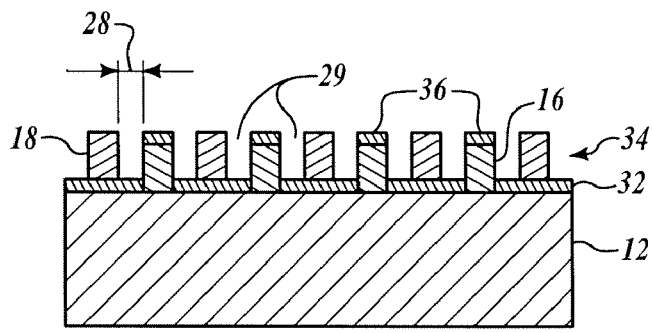
Figure 2G:
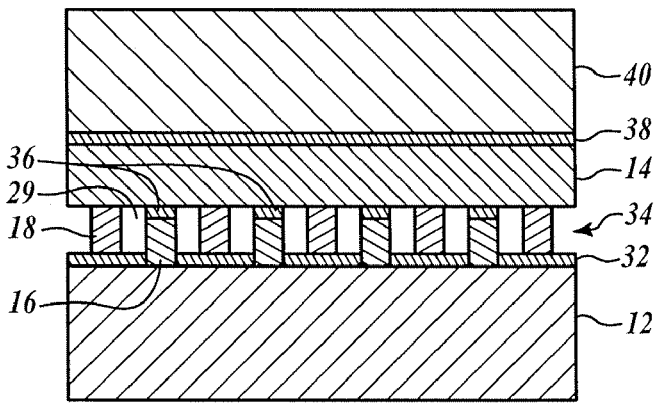
Figure 2H:
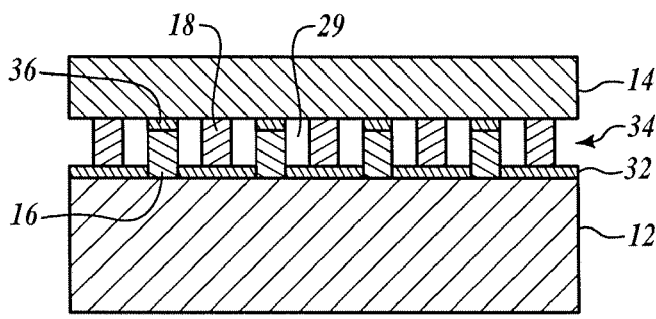

After removal of portions of the second insulating layer 36, portions of the first device layer 34 are removed, resulting in a structure including second teeth 18, spaces 29 between adjacent teeth 16, 18, and separation distance 28, as shown in FIG. 2F. Removal may be accomplished by masking, photolithography, and etching.

After removal of portions of the first device layer 34, the second teeth 18 and the remaining portions of the second insulating layer 36 are bonded to a second substrate layer 14, the second substrate layer 14 including a third insulating layer 38 and a handle substrate layer 40. Bonding may be effected using any suitable method such as metal eutectic bonding or silicon fusion bonding. This step forms the structure shown in FIG. 2G. After bonding, the handle substrate layer 40 and the third insulating layer 38 are removed by thinning using, for example, grinding or chemical and mechanical polishing, to form the structure shown in FIG. 2H.

Figure 3:
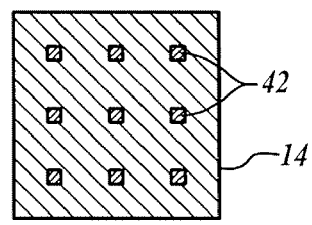
FIG. 3 shows a top view of the structure of FIG. 2H after through holes have been formed in the second substrate layer.

After thinning, through holes 42 are formed in the second substrate layer 14 (FIG. 3) such that the through holes 42 terminate at either portions of the second insulating layer 36 or between adjacent teeth 16, 18. The through holes 42 should not terminate at the second proximal ends 19 of second teeth 18. The through holes 42 may be formed by photolithography and etching.

After the through holes 42 are formed in the second substrate layer 14, an etchant (not shown) is introduced into the holes 42 where the etchant may remove the remaining portions of the insulating layers 32, 36 to release the comb structure 10 as shown in FIG. 1. The holes 42 may be sealed after releasing the comb structure 10, but it is not necessary.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method comprising:
   creating a complete tooth structure on a first wafer;
   bonding a second wafer to the tooth structure to create a comb structure; and
   releasing the comb structure,
   wherein creating includes:
   oxidizing a surface of the first wafer to create a first insulating layer;
   selectively removing portions of the first insulating layer using masking, photolithography, and etching;
   depositing a first device layer on the first insulating layer and first wafer using epitaxy;
   oxidizing a surface of the first device layer to create a second insulating layer;
   selectively removing portions of the second insulating layer using at least one of chemical and mechanical polishing; and
   selectively removing portions of the first device layer using masking, photolithography, and etching to form a first set of teeth being attached to a surface of the first wafer and to form a second set of teeth interspersed with the first set of teeth, the second set of teeth being attached to the first insulating layer between the second set of teeth and the surface of the first wafer.

2. The method of claim 1, wherein releasing includes introducing an etchant into the comb structure.

3. The method of claim 2, wherein releasing includes forming through holes in the second wafer from a top surface of the second wafer to a bottom surface of the second wafer using masking, photolithography, and etching.

4. The method of claim 3, wherein forming through holes includes forming through holes that terminate at one of an insulating layer and a space in the comb structure.

5. The method of claim 4, wherein releasing includes forming at least one hole on a surface of one of the first and second wafers for accessing the comb structure.

6. The method of claim 1, wherein the first and second wafers contain silicon.

7. The method of claim 1, wherein bonding includes at least one of metal eutectic bonding and silicon fusion bonding.

8. The method of claim 7, wherein the second wafer includes an insulating layer and a handle substrate layer, and bonding includes removing the insulating layer and the handle substrate layer.

9. The method of claim 1, wherein creating includes using oxidation, masking, photolithography, etching, epitaxy, and chemical and mechanical polishing to create the tooth structure.

10. A method comprising:
    creating a complete tooth structure on a first wafer;
    bonding a second wafer to the tooth structure to create a comb structure;
    releasing the comb structure, wherein the releasing includes:
    forming through holes in the second wafer from a top surface of the second wafer to a bottom surface of the second wafer using masking, photolithography, and etching; and
    introducing an etchant into the comb structure; and
    sealing the holes after releasing.

11. The method of claim 10, wherein creating includes:
    forming a first set of teeth attached to a surface of the first wafer;
    forming a second set of teeth interspersed with the first set of teeth, the second set of teeth being attached to a first insulating layer between the second set of teeth and the surface of the first wafer.

12. The method of claim 10, wherein bonding includes at least one of metal eutectic bonding and silicon fusion bonding.

13. The method of claim 12, wherein the second wafer includes an insulating layer and a handle substrate layer, and wherein the bonding comprises:
    removing the insulating layer and the handle substrate layer.

14. The method of claim 10, wherein the first and second wafers contain silicon.

15. The method of claim 10, wherein creating includes using oxidation, masking, photolithography, etching, epitaxy, and chemical and mechanical polishing to create the tooth structure.

* * * * *

UNITED STATES PATENT AND TRADEMARK OFFICE
CERTIFICATE OF CORRECTION

PATENT NO. : 7,479,402 B2 Page 1 of 1
APPLICATION NO. : 11/277024
DATED : January 20, 2009
INVENTOR(S) : Lianzhong Yu It is certified that error appears in the above-identified patent and that said Letters Patent is hereby corrected as shown below:

At Column 4 Line 8, Claim 5 should read:

The method of claim 2, wherein releasing includes form-

At Column 4 Line 28, Claim 10 should read:

comprises:

Signed and Sealed this

Sixteenth Day of June, 2009

JOHN DOLL
*Acting Director of the United States Patent and Trademark Office*